Figure 1:
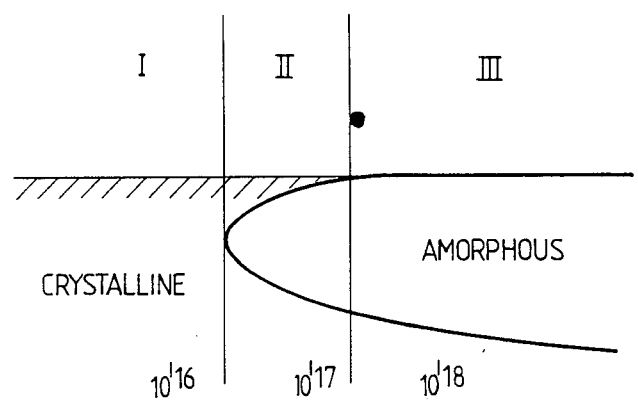

United States Patent [19]

Page et al.

[11] Patent Number: 4,894,255
[45] Date of Patent: Jan. 16, 1990

[54] MODIFICATION OF SURFACE PROPERTIES OF CERAMICS

[75] Inventors: Trevor F. Page, Girton; Philip J. Burnett, Cambridge, both of England

[73] Assignee: United Kingdom Atomic Energy Authority, London, England

[21] Appl. No.: 890,889

[22] Filed: Jul. 28, 1986

Related U.S. Application Data

[63] Continuation of Ser. No. 596,721, Apr. 4, 1984, abandoned.

[30] Foreign Application Priority Data

Apr. 15, 1983 [GB] United Kingdom ............... 8310298

[51] Int. Cl.$^4$ ............................................. C23C 14/48
[52] U.S. Cl. ................................. 427/38; 427/126.2; 427/126.3; 427/126.4; 264/22; 264/340; 250/492.2

[58] Field of Search ............... 427/38, 126.2, 126.3, 427/126.4, 399; 250/492.3; 264/22, 340

[56] References Cited

U.S. PATENT DOCUMENTS 4,088,799  5/1978  Kurtin .................................. 427/38
4,397,884  8/1983  Dube .................................... 427/38

Primary Examiner—Richard Bueker
Attorney, Agent, or Firm—William R. Hinds

[57] ABSTRACT

A method of treating of the surface of a body of a crystalline metal oxide ceramic material, comprising the operation of subjecting the said surface to bombardment with ions having an energy surfficient to disrupt the crystal lattice of the body, and continuing the ion bombardment until an amorphous layer formed in the body as a result of the ion bombardment extends to the surface of the body.

6 Claims, 3 Drawing Sheets

MODIFICATION OF SURFACE PROPERTIES OF CERAMICS

This application is a continuation of application Ser. No. 596,721, filed Apr. 4, 1984, now abandoned.

The present invention relates to the treatment of the surface regions of ceramic materials to render them less susceptible to brittle fracture.

Although metal-oxide based ceramic materials have extremely hard and stable surfaces, one of the major problems inhibiting their use as engineering materials is their tendency to suffer brittle fracture in response to surface loading.

It is known that the surface of silicon carbide or silicon can be rendered more plastic than normal by implanting ions of nitrogen into the surface to a dose level greater than $1 \times 10^{17}$ ions/cm$^2$ According to the present invention there is provided a method of treating of the surface of a body of a crystalline metal oxide ceramic material, comprising the operation of subjecting the said surface to bombardment with ions having an energy sufficient to disrupt the crystal lattice of the body, and continuing the ion bombardment until an amorphous layer formed in the body as a result of the ion bombardment extends to the surface of the body.

For any given ceramic material, there is a critical level of displacement damage above which amorphisation of the material occurs. This corresponds to a critical energy input, which can be derived as follows:

Assuming the distribution with depth of displacement damage has a Gaussian form, then the number n of displacements per cm$^3$ is given by the expression $$\delta n = \frac{\nu(E) \text{ ion dose}}{\langle X_D \rangle \cdot 10^{-4} \cdot (2\pi)^{\frac{1}{2}}} \exp[(X - \langle X_D \rangle)^2/(2\langle \Delta X_D \rangle^2)]) \quad (1)$$

where X is the distance from the surface and (E) the number of displacements of atoms in the crystal lattice of the ceramic material caused by each implanted ion. This is defined by the Kinchin-Pease model as:

$$(E) = \frac{E_c}{2E_d} \quad (2)$$

where Ed is the energy required to displace an atom from its structure site and Ec is the critical energy for efficient electronic excitation of the substrate by the ion.

Ec, expressed in electron volts, can be shown to be approximately equal to the mass in atomic mass units of the bombarding ion.

Hence, equation (1) can be re-written in terms of energy deposition as:

$$\text{keV cm}^{-3} = \frac{A \cdot \text{dose}}{\langle \Delta X_D \rangle \cdot 10^{-4} \cdot (2\pi)^{\frac{1}{2}}} \cdot [\exp(X - \langle X_D \rangle)^2/(2\langle \Delta X_D \rangle^2) \quad (3)$$

so giving the level of energy deposition at the onset of amorphisation, (the critical energy criterion, CEC) as $$CEC \text{ (keV cm}^{-3}) = \frac{A \cdot \text{dose at amorphisation}}{X_D \cdot 10^{-4} (2\pi)^{\frac{1}{2}}} \quad (4)$$

For sapphire, the critical energy criterion has been estimated as $2.8 \times 10^{23}$ keV cm$^3$. Substituting this value in equation (4) gives in the case of yttrium, for example, a critical ion dose of $3 \times 10^{16}$ ions/cm$^2$.

Figure 2:
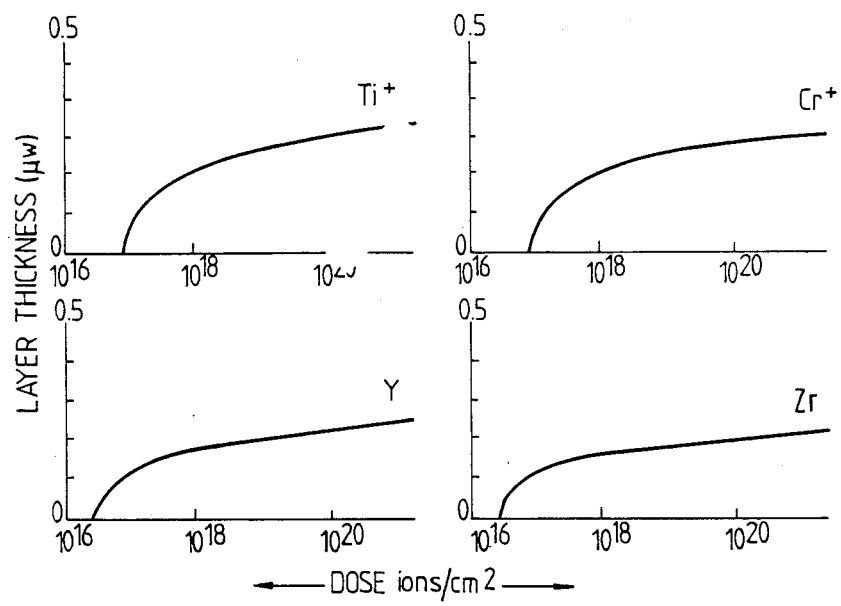
Figure 3:
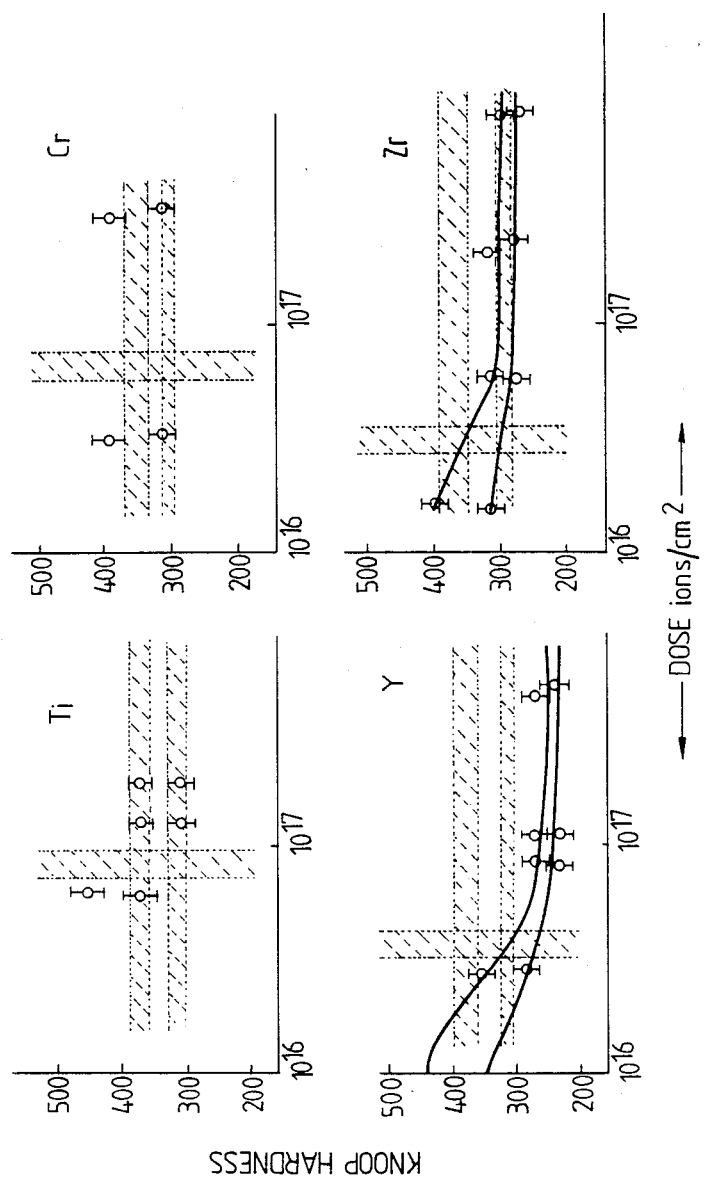
Figure 4:
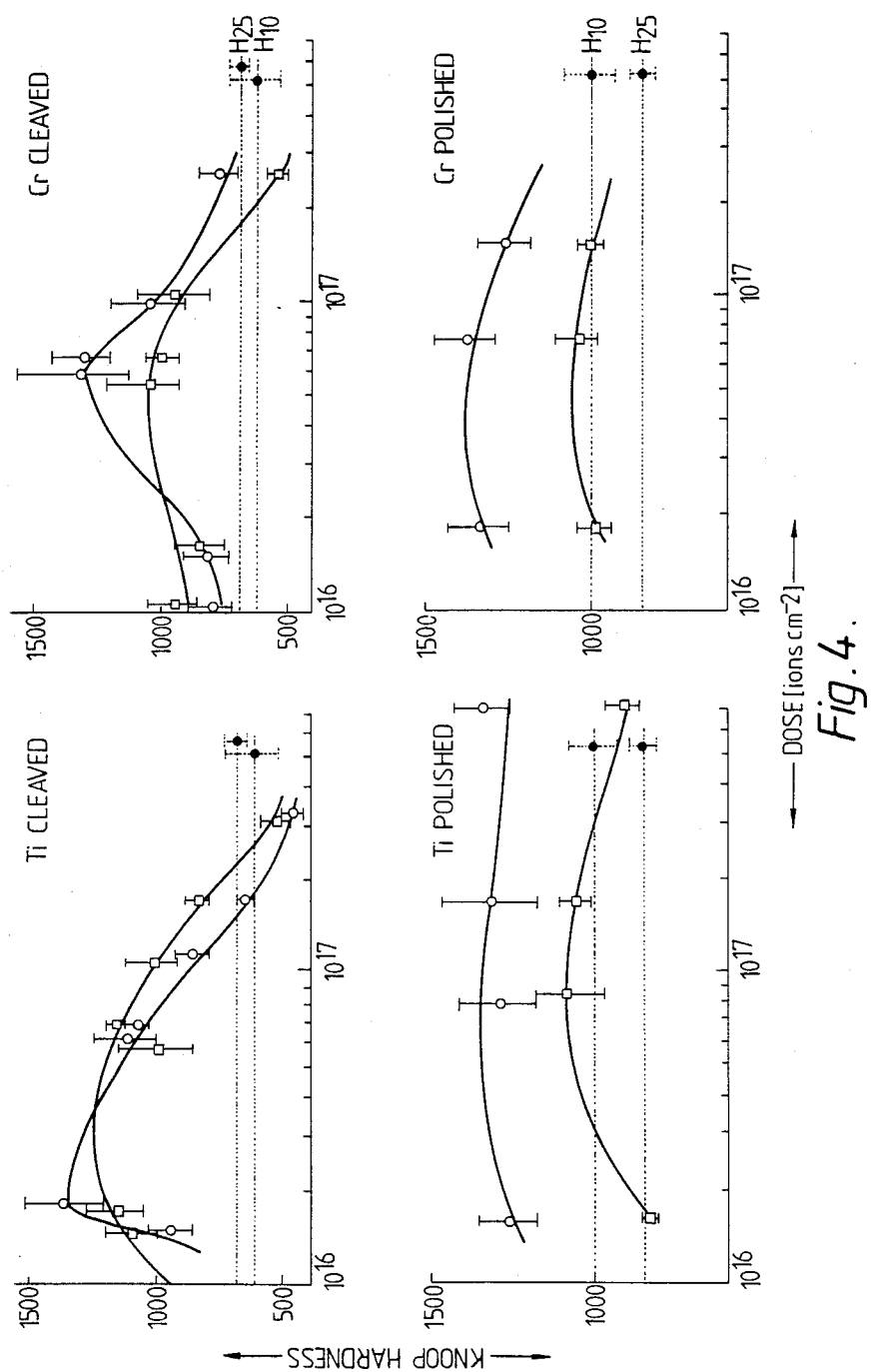

Two examples of the invention will now be described; with reference to the accompanying drawings. in which FIG. 1 shows diagrammatically the variation in size and position of implantation induced amorphous zones with ion dose, FIG. 2 shows the predicted variation of amorphous layer thickness with ion dose for saphire implanted with various ions, FIG. 3 shows the measured variation of surface hardness with ion dose for sapphire implanted with the ions used in the case of FIG. 2, and FIG. 4 shows the measured variation of surface hardness with ion dose for magnesium oxide implanted with various ions.

EXAMPLE 1

Referring to the drawings, 10–12 sections of high purity single crystal sapphire were polished on one side to a good surface finish and then implanted with Cr+, Ti+, Y+ or Zr+ ions at an energy of some 300 keV. The ion doses are given in the following table:

| Specimen | Ion Species | Dose (ions/cm$^2$) |
| --- | --- | --- |
| ST 1 | Ti+ | |
| ST 2 | Ti+ | |
| ST 3 | Ti+ | $6.3 \times 10^{16}$ |
| ST 4 | Ti+ | $1.5 \times 10^{17}$ |
| ST 5 | Ti+ | $2.3 \times 10^{17}$ |
| ST 6 | Ti+ | $7 \times 10^{17}$ |
| SC 1 | Cr+ | $3.15 \times 10^{16}$ |
| SC 2 | Cr+ | $2.6 \times 10^{17}$ |
| SC 3 | Cr+ | $6.0 \times 10^{17}$ |
| SY 1 | Y+ | |
| SY 2 | Y+ | $2.8 \times 10^{16}$ |
| SY 3 | Y+ | $9.9 \times 10^{16}$ |
| SY 4 | Y+ | $1.1 \times 10^{17}$ |
| SY 5 | Y+ | $3.8 \times 10^{17}$ |
| SY 6 | Y+ | $5.8 \times 10^{17}$ |
| SZ 1 | Zr+ | $1.5 \times 10^{16}$ |
| SZ 2 | Zr+ | $5.0 \times 10^{16}$ |
| SZ 3 | Zr+ | $5.5 \times 10^{17}$ |

The implantations were performed in a vacuum of $<10^{-6}$ torr with an ion beam current of 3 to 4 $\mu$Acm$^{-2}$, giving rise to a rise in the temperature of the substrate of some 250° C. The ion beam was oriented normal to the surface of the substrate, that is, no special precautions were taken to avoid abannelling of the implanted ions within the lattice structure of the substrate. The ion dose was determined by post-implantation Rutherford back-scattering of 2 MeV He+ ions.

Both low-load and microhardness tests and single pass scratch tests were carried out to determine the response of the implanted specimens to surface contacts. All the specimens were indented using a standard Leitz "Miniload" machine, which will not be described further, using a Knoop profile indenter under ambient conditions and at the same crystallographic orientation (parallel to $<\bar{2}021>$. Six indentations at loads of 25 gf and 50 gf were made on each specimen. The size of the long diagonal of the indentations was, typically, 10–15 $\mu$m, which corresponds to a depth of penetration of about 0.3 to 0.5 $\mu$m. This is comparable with the mean range in the substrate of the implanted ions. In each case, the mean hardness and its standard deviation were calculated from the values of the long diagonals of the indentations.

The crystallographic state of the implanted regions of the substrates was determined by means of electron channelling patterns obtained with a scanning electron microscope, Rutherford back-scattering, and electron diffraction in a transmission electron microscope.

The results are shown in FIG. 3. For each species, there is at least one specimen implanted to a dose level below that required for the onset of amorphisation (indicated by the shaded vertical bars), which enables the effects of the formation of solid solutions to be distinguished from those of amorphisation. It can be seen that, in general, ion implantation to dose levels below that required for the onset of amorphisation results in an increase in the hardness of the implanted surface, whereas dose levels above the critical value result in a softening of the implanted surface.

Examination with a scanning electron microscope of both indentations and scratch test marks on the high dose level implanted surfaces shows a substantial increase in plastic behaviour of the implanted surface compared with that of unimplanted regions of the surfaces of the specimens.

EXAMPLE II

High purity (100) habit single crystals of magnesium oxide (MgO) were cleaved into (100) surface slices. One group was left as cleaved, and the other was polished on diamond impregnated cloths to a 0.25 μm finish prior to ion implantation. Both groups of crystals were implanted with Ti+ and Cr+ ions at energies of 30 KeV to ion doses in the range $10^{16}$–$10^{18}$ ions cm$^{-2}$. As before, the doses were determined by post-implantation Rutherford back-scattering, and are given in the table below:

| Specimen | ion species | dose |
| --- | --- | --- |
| cleaved | | |
| MC 1 | Cr+ | $1.0 \times 10^{16}$ |
| MC 2 | Cr+ | $1.48 \times 10^{16}$ |
| MC 3 | Cr+ | $6.12 \times 10^{16}$ |
| MC 4 | Cr+ | $6.80 \times 10^{16}$ |
| MC 5 | Cr+ | $1.02 \times 10^{17}$ |
| MC 6 | Cr+ | $2.45 \times 10^{17}$ |
| MT 1 | Ti+ | $1.45 \times 10^{16}$ |
| MT 2 | Ti+ | $1.65 \times 10^{16}$ |
| MT 3 | Ti+ | $6.33 \times 10^{16}$ |
| MT 4 | Ti+ | $6.80 \times 10^{16}$ |
| MT 5 | Ti+ | $1.0 \times 10^{17}$ |
| MT 6 | Ti+ | $1.74 \times 10^{17}$ |
| MT 7 | Ti+ | $3.38 \times 10^{17}$ |
| polished | | |
| MCP 1 | Cr+ | $1.8 \times 10^{16}$ |
| MCP 2 | Cr+ | $7.3 \times 10^{16}$ |
| MCP 3 | Cr+ | $1.4 \times 10^{17}$ |
| MCP 4 | Cr+ | $6.9 \times 10^{17}$ |
| MTP 1 | Ti+ | $1.4 \times 10^{16}$ |
| MTP 2 | Ti+ | $7.8 \times 10^{16}$ |
| MTP 3 | Ti+ | $1.6 \times 10^{17}$ |

-continued

| Specimen | ion species | dose |
| --- | --- | --- |
| MTP 4 | Ti+ | $8.1 \times 10^{17}$ |

Again, Knoop microhardness tests were carried out using a Leitz "Miniload" machine, but this time at loads of 10 gf and 25 gf. The long axis of the indenter of the machine was aligned along a <100> direction of each surface when under test. The hardness was determined from the length of the diagonals of the indentations, as before. The loads of 10 and 25 gf correspond to penetration depths of 0.3–0.6 μm, which is comparable with the mean range of the implanted ions.

The results are shown in FIG. 4. It can be seen that for both polished and as-cleaved surfaces the trend is for hardness to increase up to a dose level of about $0.8 \times 10^{16}$ ions/cm$^2$. Thereafter, the hardness starts to decrease until, in the case of the as-cleaved surfaces, it falls below that of the unimplanted surface. For both Cr+ and Ti+ implanted into the as-cleaved surfaces, initially the 10 gf Knoop hardness ($H_{10}$) is less than the 25 gf Knoop hardness, but as the surfaces become hardened by the implantation process, $H_{10}$ becomes greater than $H_{25}$. For Ti+ ions, this order then reverses again at high dose levels.

For the polished surfaces the polishing process produces a thin (0.2 μm) works hardened layer on the surfaces. This causes $H_{10}$ to be $>H_{25}$ at all times, and also reduces the change in hardness with dose level compared with the case of the as-cleaved surfaces.

We claim:

1. A method of treating of the surface of a body of a crystalline metal oxide ceramic material to render the said surface less susceptible to brittle fracture, comprising the operation of subjecting the said surface to bombardment with ions having an energy sufficient to disrupt the crystal lattice of the body, and continuing the ion bombardment until an amorphous layer formed in the body as a result of the ion bombardment extends to the surface of the body, wherein the ions are selected from the group consisting of Ti+, Cr+, Y+, and Zr+.

2. A method according to claim 1 wherein the metal oxide crystalline material is aluminum oxide.

3. A method according to claim 2 wherein the ions are Y+ and the ion dose is at least $3 \times 10^{16}$ ions/cm$^2$.

4. A method of treating of the surface of a body of a crystalline metal oxide ceramic material to render the said surface less susceptible to brittle fracture, comprising the operation of subjecting the said surface to bombardment with ions having an energy sufficient to disrupt the crystal lattice of the body, and continuing the ion bombardment until an amorphous layer formed in the body as a result of the ion bombardment extends to the surface of the body, wherein the metal-oxide crystalline material is magnesium oxide.

5. A method according to claim 4 wherein the ions are Cr+ or Ti+ ions.

6. A method according to claim 5 wherein in the ion dose is at least $0.8 \times 10^{16}$ ions/cm$^2$.

* * * * *